United States Patent [19]

Ishihara et al.

[11] Patent Number: 5,406,218

[45] Date of Patent: Apr. 11, 1995

[54] PHASE DEMODULATOR RECEIVING INPUTS FROM PHASE DETECTOR AND BINARY PHASE DETECTOR

[75] Inventors: Yukihito Ishihara, Ohme; Kazuo Yamakido, Hinode; Takao Okazaki, Hamura; Katsuhiro Furukawa, Ohme, all of Japan

[73] Assignee: Hitachi, Ltd., Tokyo, Japan

[21] Appl. No.: 194,074

[22] Filed: Feb. 9, 1994

[30] Foreign Application Priority Data

Feb. 19, 1993 [JP] Japan ................................. 5-055190

[51] Int. Cl.6 .............................................. H03D 3/20
[52] U.S. Cl. ................................. 329/346; 375/328; 455/214
[58] Field of Search ................ 329/345, 346, 306, 310, 329/336, 343, 345; 375/80, 82, 94; 455/214

[56] References Cited

U.S. PATENT DOCUMENTS 5,313,170  5/1994  Kojima ............................ 329/310 X

OTHER PUBLICATIONS

White Series No. 105 Linear Digital Modulation Method for Mobile Communication, editor Trikepps Publication Department, publisher Ken Kawauchi, publishing office Trikepps, Ltd., published Mar. 14, 1990, pp. 114–117, 137 and 140. (Provided in Japanese with English translation attached.).

Primary Examiner—Siegfried H. Grimm
Attorney, Agent, or Firm—Fay, Sharpe, Beall, Fagan, Minnich & McKee

[57] ABSTRACT

A demodulation circuit comprises: a phase detection circuit for determining an absolute value of a phase difference between an input signal to be demodulated and a reference signal; a binary phase detection circuit for converting a phase lead or lag between the input signal and the reference signal into a sign of phase difference; and a phase demodulation circuit for calculating, from the absolute value and the sign of phase difference, a phase difference quantity between the input signal and the reference signal and for performing a delay detection on the phase difference quantity; wherein the binary phase detection circuit includes a delay circuit which generates a delay time corresponding to the operation delay of the phase detection circuit; and wherein the phase detection circuit includes a level limiter circuit to limit an internal signal voltage and a reference voltage adjust circuit to correct deviations in the internal signal voltage.

8 Claims, 6 Drawing Sheets

PHASE DEMODULATOR RECEIVING INPUTS FROM PHASE DETECTOR AND BINARY PHASE DETECTOR

BACKGROUND OF THE INVENTION

The present invention relates to a demodulation circuit for demodulating phase-modulated input signals and more particularly to a demodulation circuit that is suitably realized by semiconductor integrated circuits and is effectively applied, for example, to portable communication terminal apparatuses.

A circuit for demodulating phase-modulated signals may use a phase detection circuit and a binary phase detection circuit. A combination of the phase detection circuit and the binary phase detection circuit is used where a multi-value phase demodulation is required. Among literatures concerning the phase detection circuit and the binary phase detection circuit may be cited a book "Digital Modulation/Demodulation Technology for Mobile Communications" (edited by Yoshihiko Akaishi), page 137, published by Kabushiki Kaisha Trikepps on Mar. 14, 1990.

Figure 6:
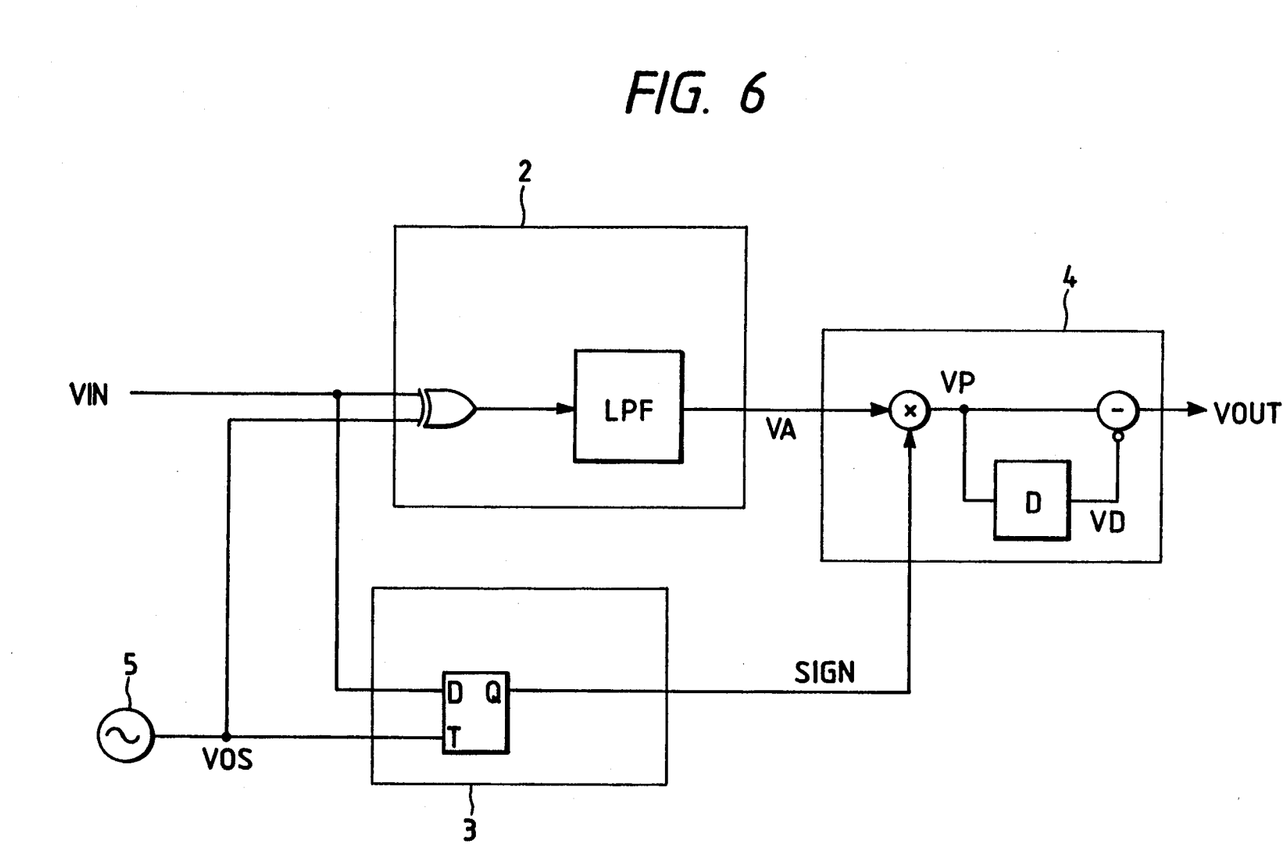
FIG. 6 is a block diagram showing the working principle of the demodulation circuit studied by the inventors of this invention.

FIG. 6 shows the working principle of a demodulation circuit that the inventors studied based on the above-mentioned literature before the present invention was accomplished. A phase-modulated input signal VIN and an output VOS of a local oscillation circuit 5 are entered into a phase detection circuit 2 and a binary phase detection circuit 3. The phase detection circuit 2 converts the absolute value of a phase difference between the input signal VIN and the output VOS of the local oscillation circuit 5 into a voltage VA, which is then output. The binary phase detection circuit 3 detects a lead or lag in phase angle between the input signal VIN and the local oscillator output VOS and produces an output SIGN representing the phase lead or lag. The absolute value VA of the phase difference and the signal SIGN representing the phase lead or lag are multiplied to form a phase difference quantity VP. A difference is taken between the phase difference quantity VP and a signal VD—which is obtained by delaying the phase difference quantity VP one unit of modulation or one symbol (1 baud rate) by a delay means D—to produce a demodulated output VOUT. The delay corresponding to one symbol may be given prior to the phase detection circuit 2.

SUMMARY OF THE INVENTION

In the demodulation circuit of FIG. 6, when a digital circuit like a shift register is used as the delay circuit D, the output VA of the phase detection circuit 2 must be converted to a digital signal by an A/D convertor. Such a circuit configuration gives rise to a possibility that errors may be caused by a dynamic range mismatch between the output voltage range of a low-pass filter LPF included in the phase detection circuit 2 and the operation range of the A/D convertor. Further, the inventor has found that because the phase difference absolute value VA and the phase lead/lag signal SIGN, though both made from the same source signals VIN and VOS, are formed by different circuits, there is a possibility of demodulation errors occurring due to deviations of supply timing of the source signals to these circuits and also due to unequal delay times of these circuits. Errors may also be produced by characteristic variations resulting from manufacturing conditions of circuit elements such as resistors, capacitors and transistors. Hence, forming the demodulation circuit by using semiconductor integrated circuits makes it essential to prevent the occurrence of demodulation errors as by virtually freeing the modulation circuit from influences of the characteristic variations of the constituent circuit elements during manufacture.

The objective of the present invention is to minimize modulation errors produced in a modulation circuit that uses a phase detection circuit and a binary phase detection circuit.

Another object of the invention is to provide a modulation circuit suitable for use with semiconductor integrated circuit applications, which is virtually free from influences of characteristic variations of circuit elements due to manufacturing errors and which can suppress modulation errors to a virtually negligible level.

These and other objects and novel features of this invention will become apparent from the following description in this specification and the accompanying drawings.

Representative aspects of the present invention disclosed in this specification may be briefly summarized as follows.

That is, the demodulation circuit of this invention comprises:

a phase detection circuit for determining a digital absolute value of a phase difference between an input signal to be demodulated and a reference signal;

a binary phase detection circuit for converting a phase lead or lag between the input signal and the reference signal into a sign of phase difference; and a phase demodulation circuit for calculating, from the absolute value and the sign of phase difference, a phase difference quantity between the input signal to be demodulated and the reference signal and for performing a delay detection on the phase difference quantity;

wherein the binary phase detection circuit includes a delay means which generates a delay time corresponding to the operation delay of the phase detection circuit; and wherein the phase detection circuit includes a level limiter circuit to limit an internal signal voltage and a reference voltage adjust circuit to correct deviations in the internal signal voltage.

To describe in more detail, the phase detection circuit may include: a comparator circuit for quantizing the input signal into a binary value; an exclusive-OR circuit that takes in the output of the comparator circuit and a reference signal; a level limiter circuit for limiting the output voltage level of the exclusive-OR circuit; a low-pass filter for passing only a low frequency component of the output signal of the level limiter circuit; an A/D convertor circuit for converting the analog output of the low-pass filter into a digital signal representing the absolute value of the phase difference; and a reference voltage adjust circuit that takes in the output of the A/D convertor circuit to adjust the dynamic range of the A/D convertor circuit. The control target for the reference voltage adjust circuit may be the level limiter circuit instead of the A/D convertor circuit.

The binary phase detection circuit may include: a first flip-flop circuit which takes in the output signal of the comparator circuit; a first delay circuit which takes in the reference signal and sends its output as a clock to the first flip-flop circuit and thereby apparently eliminates a setup time of the first flip-flop circuit; a second delay circuit provided at the output of the first flip-flop circuit to produce a delay virtually matching the operation delay time of the low-pass filter of the phase detection circuit; and a second flip-flop circuit which receives the sampling clock signal for the A/D convertor circuit as a clock input and also the output of the second delay circuit to produce a sign of the phase difference. Considering the fact that the operation delay of the first flip-flop circuit is a gate delay, the first delay circuit is constructed of a circuit that generates a delay by the gate delay. Because the second delay circuit corresponds to the operation delay of the low-pass filter, it is constructed as a circuit that generates a delay analogwise.

The phase demodulation circuit may include: a multiplication circuit that takes in the absolute value and sign of the phase difference; a shift register that delays the output of the multiplication circuit by one unit element of modulation in order to perform a delay detection; and a subtraction circuit that subtracts the value of the shift register from the output of the multiplication circuit.

The aforementioned objectives can be achieved by the above configuration. That is, the level limiter circuit and the reference voltage adjust circuit in the phase detection circuit combine to reduce errors that would be caused by deviations in the internal signal voltage when the internal analog signal is converted into a digital signal by the A/D convertor circuit.

The delay circuit and flip-flop circuit used to make equal the delay times of the phase detection circuit and of the binary phase detection circuit reduce errors that would be caused by the difference in delay time between the phase detection circuit and the binary phase detection circuit when the phase difference quantity is determined by the multiplication logic.

Considering the fact that the operation delay of the first flip-flop circuit is a gate delay, the first delay circuit is constructed of a circuit that generates a delay by the gate delay. Also considering that the second delay circuit corresponds to the operation delay of the low-pass filter, it is constructed of a circuit that generates a delay analogwise.

When the demodulation circuit is constructed in the form of a semiconductor integrated circuit, if there are absolute variations in the circuit component characteristics due to manufacturing errors, the relative variations in characteristic between the circuit elements making up the phase detection circuit and those of the binary phase detection circuit can be reduced to a virtually negligible level. That is, the demodulation circuit is not affected by variations in the manufacturing process and thus can reduce the errors due to deviations in the internal signal voltages. This in turn reduces the demodulation circuit's susceptibility to influences of manufacturing errors of circuit elements and therefore eliminates demodulation errors.

BRIEF DESCRIPTION OF THE DRAWINGS

FIGS. 2(A)–2(L) are a diagram showing example operation signal waveforms produced by the demodulation circuit according to this invention;

DESCRIPTION OF THE PREFERRED EMBODIMENTS

Figure 1:
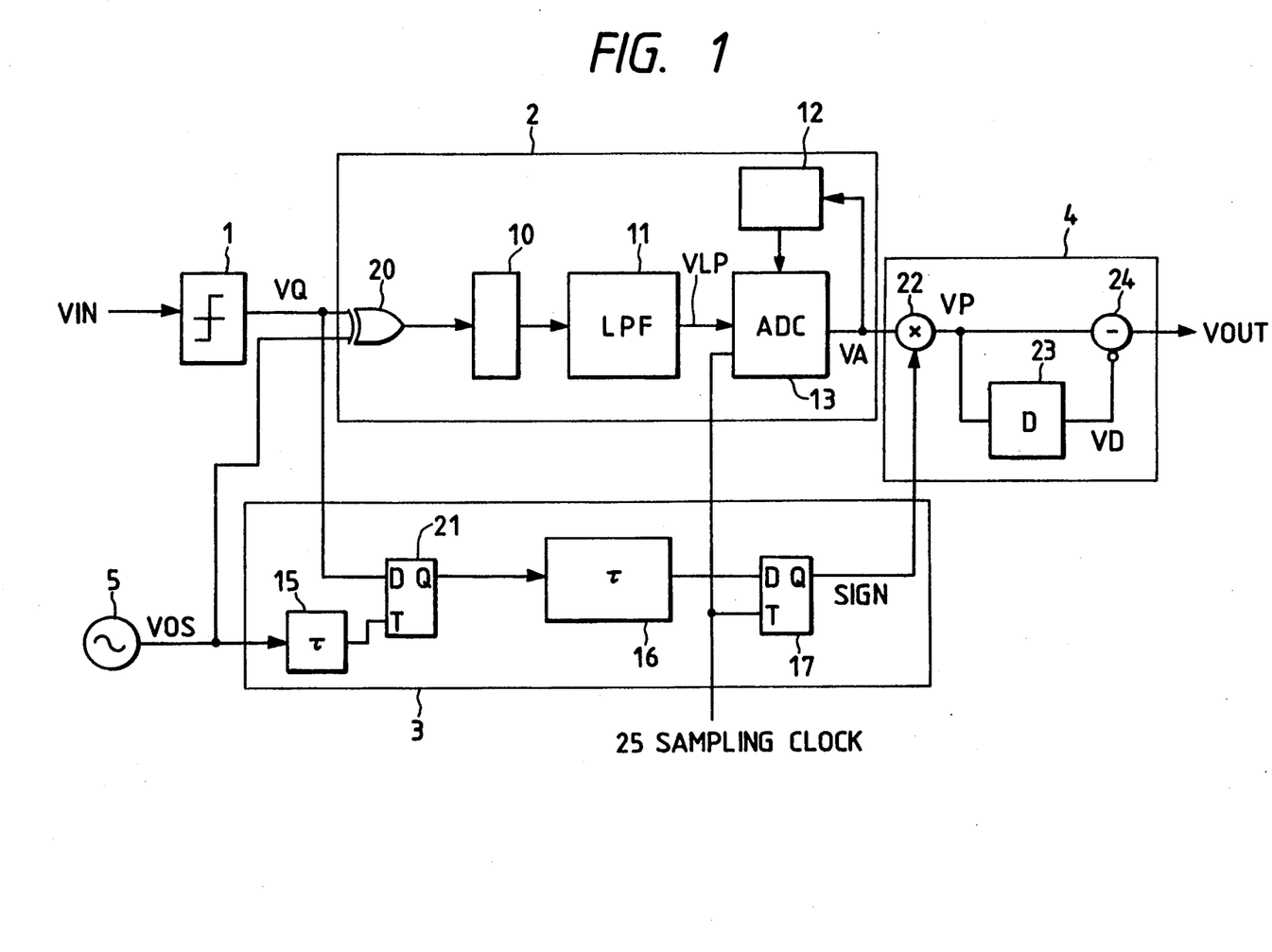
FIG. 1 is a block diagram showing one embodiment of the demodulation circuit according to the present invention.
Figure 2A:
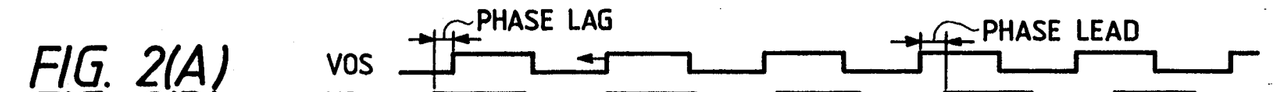
Figures 2B, 2C:
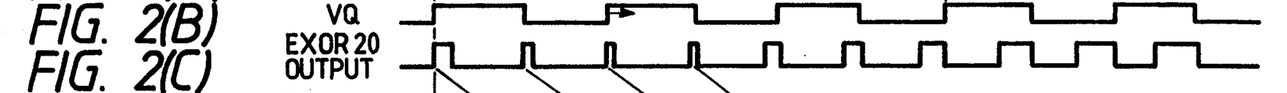
Figure 2D:
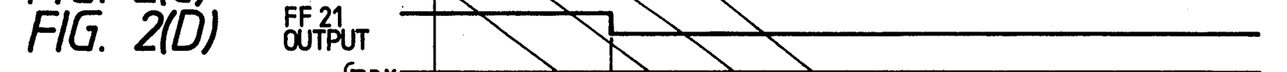
Figure 2E:
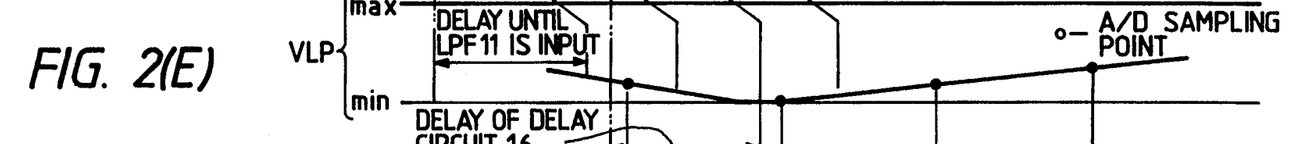
Figure 2F:
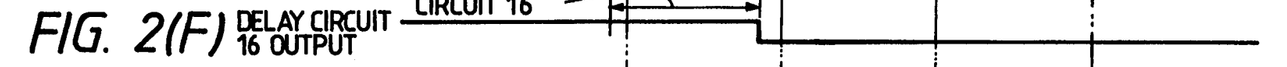
Figure 2G:
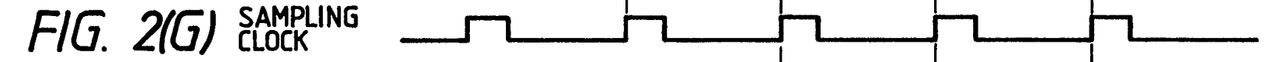
Figure 2H:
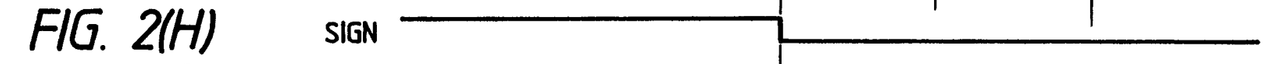
Figure 2I:
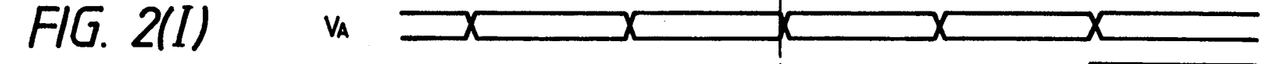
Figure 2J:
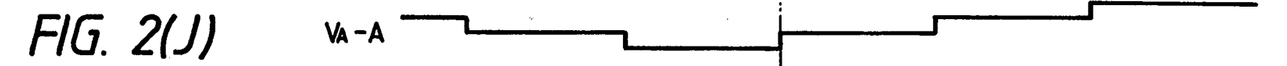
Figure 2K:
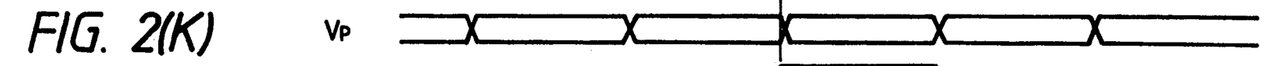
Figure 2L:
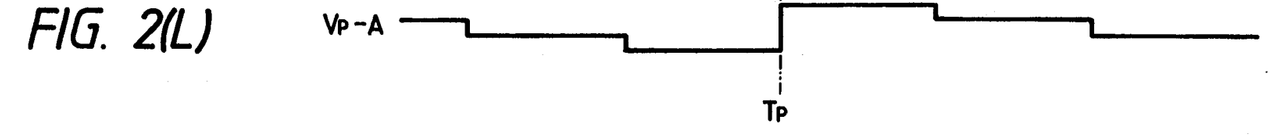

FIG. 1 shows a block diagram of an example demodulation circuit embodying the present invention. FIGS. 2(A) through 2(L) show example signal waveforms produced by the demodulation circuit of this embodiment. The demodulation circuit of FIG. 1 includes: a comparator circuit 1 that receives a phase-modulated input signal VIN and quantizes it into a binary signal VQ as an output; a phase detection circuit 2 that receives the output VQ of the comparator circuit 1 and an output signal VOS of a local oscillation circuit; a binary phase detection circuit 3; a phase demodulation circuit 4; and a local oscillation circuit 5. The local oscillation circuit 5 generates a signal VOS (see FIG. 2(A)) with almost the same frequency as the signal VQ. The generated output signal VOS is used as a reference signal.

The input signal VIN is a phase-modulated signal, which is to be demodulated. The input signal VIN is quantized and converted into a binary signal VQ (see FIG. 2(B)) by the comparator circuit 1. The phase detection circuit 2 converts the absolute value of the phase difference between the quantized input signal VQ and the reference signal VOS from the local oscillation circuit 5 into a voltage (phase difference voltage VLP), which is then converted into a digital signal VA by the A/D convertor 13. A level limiter 10 is inserted in order to make the operating range of the A/D convertor 13 and the range of the phase difference voltage VLP match each other. For a finer adjustment of the range matching, a reference voltage adjust circuit 12 is added to the A/D convertor 13. That is, the phase detection circuit 2 converts the absolute value of the phase difference between the quantized input signal VQ and the local oscillation circuit's reference signal VOS into a pulse width by an exclusive-OR circuit 20 (see FIG. 2(C), output waveform EXOR20). The pulse width signal is then fed to a low-pass filter (LPF) 11, which produces at its output a voltage VLP (see FIG. 2(E), waveform VLP) which is an average output level of the exclusive-OR circuit 20. The operating range of the low-pass filter (LPF) 11, which is an analog circuit, is small compared with a voltage range between the supply voltage VDD and the ground voltage VSS.

The low-pass filter 11 is provided with an active element (circuit) such as an amplifier circuit, as will be explained by referring to FIG. 3. For a reduced power consumption, the active circuit is formed as a CMOS circuit consisting of a p-channel MOSFET and an n-channel MOSFET. The active circuit has its output voltage on the supply voltage side set to a value smaller than the supply voltage VDD by the threshold voltage of the p-channel MOSFET. The output voltage of the active circuit on the ground voltage side is set to a value higher than the ground voltage by the threshold voltage of the n-channel MOSFET. The level limiter 10 is provided to make the output voltage range of the exclusive- OR circuit (EXOR) 20 match the operating voltage range of the low-pass filter. In other words, the level limiter 10 can be understood to have a function of matching the operation range of the A/D convertor 13 to the range of the phase difference voltage VLP. For a fine adjustment of the operation range of the A/D convertor, the A/D convertor 13 is provided with a reference voltage adjust circuit 12.

The binary phase detection circuit 3 detects a phase lead or lag between the quantized input signal VQ and the reference signal VOS of the local oscillation circuit 5 and outputs it as a binary sign signal SIGN. The binary phase detection circuit 3 includes delay circuits 15, 15 and flip-flop circuits 17, 21 to make equal the delay times of the sign signal SIGN output from the binary phase detection circuit 3 and of the output VA of the phase detection circuit 2. The absolute value VA of the phase difference and the phase lead/lag sign SIGN are multiplied by a multiplication logic 22 such as an exclusive-OR circuit to generate a phase difference quantity VP reflecting the phase lead and lag. The phase difference quantity VP is then delayed one symbol by a shift register (D) 23 to produce data VD. The delayed data VD and the phase difference quantity VP are fed to a subtraction logic 24 that produces their difference, which is a demodulated output VOUT. With this configuration, the level limiter 10 and the reference voltage adjust circuit 12 in the phase detection circuit 2 make it possible to reduce errors that would be caused by a shift in the internal signal voltage when the internal analog signal is converted into a digital signal by the A/D convertor 13. The flip-flop circuits 21, 17 in this embodiment are of an edge trigger type, although other types may be used.

FIG. 2(I) represents the digital output VA and, for easy understanding, FIG. 2(J) shows an analog voltage $V_A$-A that corresponds to the digital output VA. FIG. 2(K) illustrates the digital phase difference quantity VP. For reference, an analog voltage $V_P$-A corresponding to the phase difference quantity VP is shown in FIG. 2(L). From FIG. 2(A) through FIG. 2(L), it is seen that the sign signal SIGN is inverted at a timing Tp. Thus, the analog voltage $V_P$-A undergoes a change at the timing Tp as shown.

Now, let us turn to FIG. 1. In FIG. 1, the delay circuit 15 that delays the locally oscillated output VOS is used to apparently eliminate the setup time of the flip-flop circuit 21 that takes in the quantized input signal VQ from the comparator circuit 1 as a data input. Let us consider a case where the signals VQ and VOS are in phase with each other. Because the flip-flop circuit 21 has a gate delay, it cannot take in a change in the signal VQ in synchronism with a change in the locally oscillated output VOS. To enable these changes to be taken in simultaneously, the setup time characteristic of the flip-flop circuit 21 must be considered. The delay circuit 15 delays the locally oscillated output VOS in such a manner as to apparently eliminate the setup time. This allows the flip-flop circuit to detect even a slight change between phase lag and lead with high precision. This in turn permits a change between the phase lag and lead to be produced at the output of the flip-flop circuit 21 in synchronism with a change in the pulse width at the output of the exclusive-OR circuit which corresponds to the phase difference.

The delay circuit 16 has an amount of delay corresponding to the operation delay time of the low-pass filter 11. The flip-flop 17 takes in the output of the delay circuit 16 (see FIG. 2(F)) in synchronism with a sampling clock 25 (FIG. 2(G)) of the A/D convertor In this embodiment, the conversion operation of the A/D convertor 13 is established prior to the next sampling cycle of the sampling clock 25. The sign signal SIGN is fed to the multiplication logic 22 in synchronism with the output VA of the A/D convertor 13. In this way, the delay circuits and flip-flop circuits, used to make equal the delay times of the phase detection circuit 2 and of the binary phase detection circuit 3, can reduce errors in the phase difference quantity VP at the output of the multiplication logic 22 which would occur when there is a difference in delay time between the two circuits.

Figure 3:
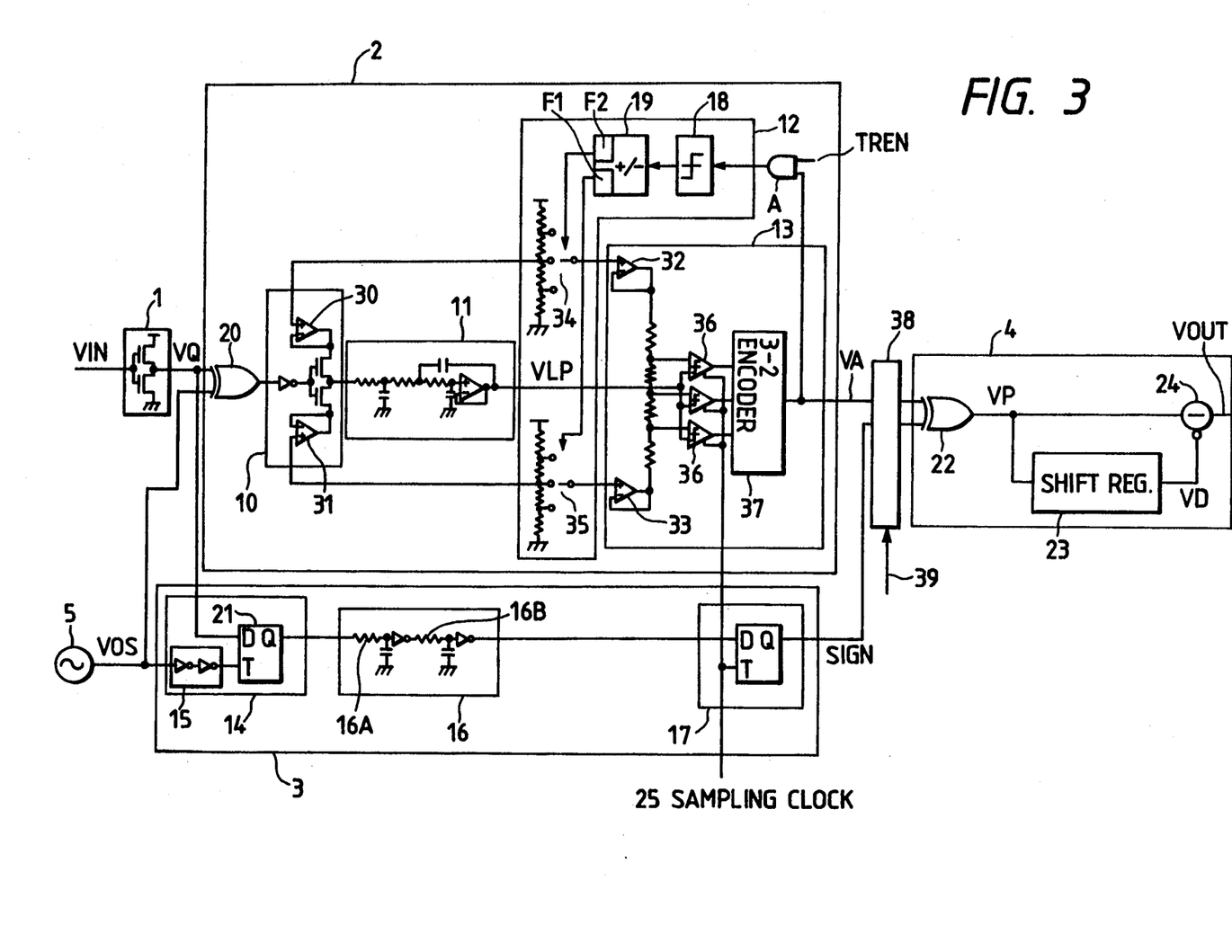
FIG. 3 is a circuitry showing the details of the embodiment of FIG. 1.

FIG. 3 shows the detailed circuit of the embodiment of FIG. 1. In FIG. 3, the comparator circuit 1 may be formed by CMOS inverter circuit, and it functions as a two-value quantizing circuit. In the phase detection circuit 2 the following operations are performed. The exclusive-OR circuit 20, which receives at its two inputs the quantized input signal VQ and the output VOS of the local oscillation circuit 5, converts the absolute value of the phase difference between the two input signals into a pulse width. The level limiter 10 limits the range of its output voltage. The low-pass filter 11 converts the absolute value of the phase difference into a voltage value, which is then converted into a digital value VA by the A/D convertor 13. The A/D convertor 13 is added with a reference voltage adjust circuit 12 to make equal the output voltage range of the low-pass filter 11 and the dynamic range of the A/D convertor 13. The level limiter 10 is realized by supplying the CMOS inverter power by using amplifiers 30, 31. To secure the current drive capability, a source-follower amplifier may be used at the output of the amplifiers 30, 31. The low-pass filter 11 may use a Butterworth filter to make the phase delay frequency characteristic of this circuit as flat as possible.

The A/D convertor 13 may be of a flush type (or parallel comparison type). The reference voltage for the A/D convertor 13 is supplied by using amplifiers 32, 33 as in the case with the level limiter 10. While the convertor in this example uses two bits, it may also use five to eight bits depending on the required precision. The dynamic range of the A/D convertor 13 must agree with the range of the input signal VLP for facilitating the computation at later stages. The reference voltage adjust circuit 12 is designed to output the supply voltage values before and after the level limiter 10 and selects one of the output voltages by switches 34, 35. The reference voltage adjust circuit 12 includes a decision circuit 18 and an addition circuit 19. The decision circuit 18 performs, for example, a first operation to judge whether the output VA of the A/D convertor 13 is the minimum value and a second operation to check if the output VA of the A/D convertor 13 is the maximum value. In synchronism with the first operation by the decision circuit 18, the addition circuit 19 controls the selected state of the switch 35. For example, when the output VA is not the minimum value, the selection level of the switch 35 is changed to a relatively low level. When the output VA becomes equal to the minimum value, the selection state of the switch 35 is held in a holding circuit F1 in the addition circuit 19. When the decision circuit 18 performs the second operation, the addition circuit 19 controls the selection state of the switch 34 in synchronism with the second operation. When, for example, the output VA is not the maximum value, the selection level of the switch 34 is changed to a relatively high level. When the output VA reaches the maximum value, the selection state of the switch 34 is held in a holding circuit F2 in the addition circuit 19. Such level changing of the switches 34, 35 is accomplished by the following training operations. When, for instance, the input signal VIN and the locally oscillated output VOS are both assumed to be high, the output of the exclusive-OR circuit 20 has a low level, thus holding the output of the low-pass filter 11 at a low level. At this time, the decision circuit 18 checks whether or not the output VA of the A/D convertor 13 is the minimum value and, according to the result of this check, the addition circuit 19 next to the decision circuit 18 controls the selection state of the switch on the low level side. Similarly, when the input signal VIN is assumed to be high and the locally oscillated output VOS low, the output of the exclusive-OR circuit 20 will be high, holding the output of the low-pass filter 11 at a high level. In this case also, the decision circuit 18 and the addition circuit 19 control the selection state of the switch on the high level side. The above training operation may be carried out only when power is turned on or when a standby state is cleared (i.e., when the system condition is switched from a standby state, in which demodulation is not performed, to a call ready state, in which demodulation can be performed allowing a call to be made). Once the reference voltage adjustment has been completed, the circuits (the holding circuits F1, F2) to maintain the output of the addition circuit 19 are kept operational only during a call when the demodulation is required, while rendering the remaining circuit portions of the reference voltage adjust circuit 12 (such as the decision circuit) inactive or turned off. This minimizes the power consumption of the reference voltage adjust circuit 12.

Figure 5:
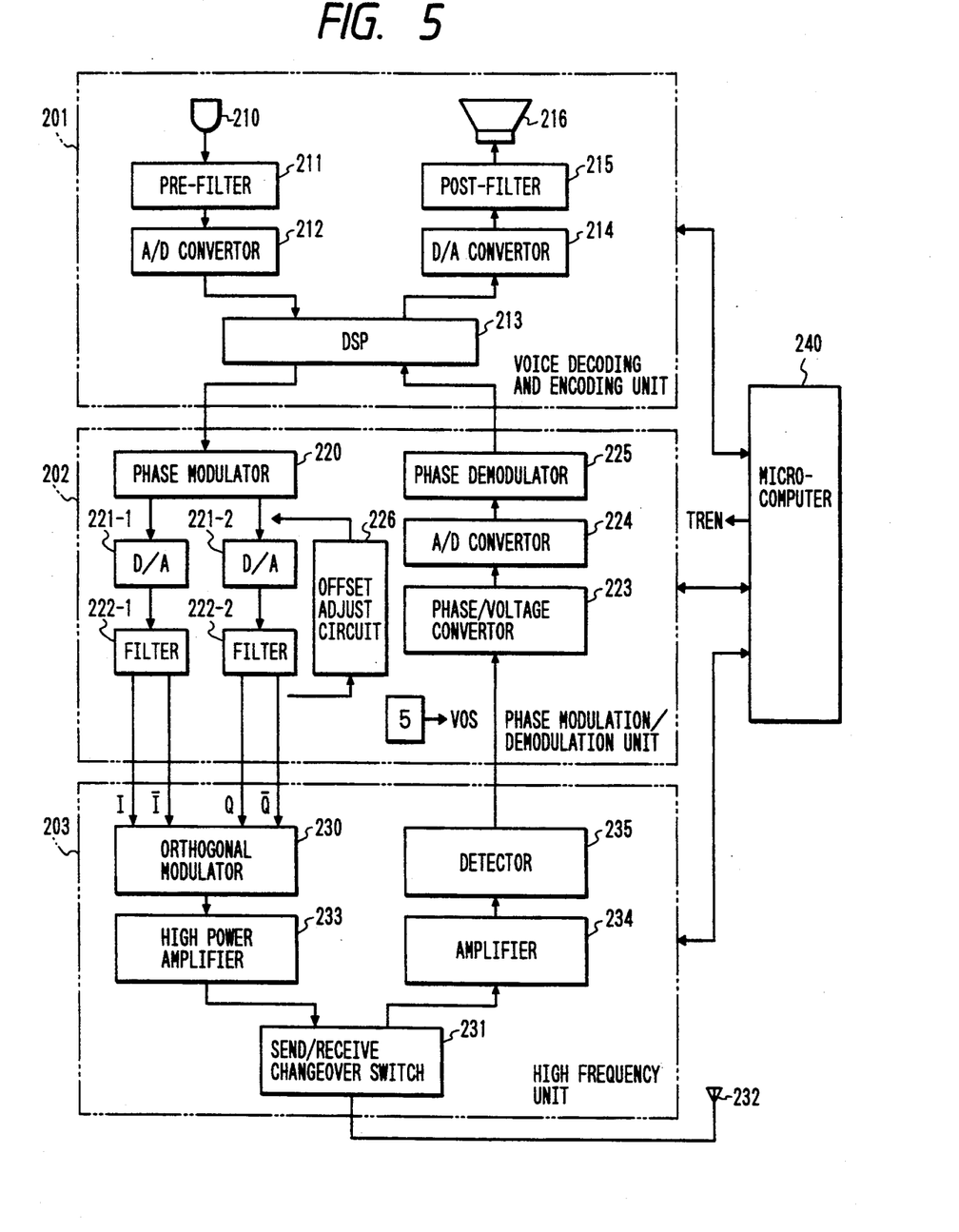
FIG. 5 is a block diagram showing an example of the phase modulator/demodulator incorporating an offset adjust circuit according to this invention and of the portable communication terminal equipment.

When power is turned on or when the standby state is cleared, this is detected by a microcomputer 240 shown in FIG. 5 which then outputs a training signal TREN. In the embodiment shown in FIG. 3, the training signal TREN and the digital signal VA are supplied to a logic gate (AND gate) A. As a result, only during the training operation, the digital output signal VA of the A/D convertor is fed to the reference voltage adjust circuit 12, which then makes the reference voltage adjustment mentioned above. The training signal TREN is set high during the training operation and, with the elapse of a specified period of time, is set low. This contributes to minimizing the power consumption mentioned above.

In the A/D convertor 13, a level is checked by a plurality of comparators 36 and converted by an encoder 37 into a binary signal VA. The binary phase detection circuit 3 consists of a binary decision circuit 14, an RC delay circuit 16 as a second delay means, and a timing adjust latch 17 formed by a flip-flop circuit. The binary decision circuit 14 includes a flip-flop 21 that receives the quantized signal VQ at its data input terminal and a delay circuit 15 as a first delay means which acts to apparently eliminate the setup time of the flip-flop 21.

The delay circuit 15 apparently removes the setup time of the flip-flop circuit 21 that receives at its data input the quantized input signal VQ from the comparator circuit 1. When, for example, the signals VQ and VOS are in phase, the flip-flop circuit 21 cannot take in a change in the signal VQ in synchronism with a change in the locally oscillated output VOS because the flip-flop circuit 21 has a gate delay. For the two signals to be received simultaneously, it is necessary to consider the setup time characteristic of the flip-flop circuit 21. The delay circuit 15 delays the locally oscillated output VOS in a manner that will apparently eliminates such a setup time. This allows the flip-flop circuit to detect even a slight change between phase lag and lead with high precision. This in turn permits a change between the phase lag and lead to be produced at the output of the flip-flop circuit 21 in synchronism with a change in the pulse width at the output of the exclusive-OR circuit 20 which corresponds to the phase difference. The delay circuit 15, as shown in FIG. 3, includes an even number of series-connected inverter stages, and the desired delay time is obtained by the gate delay of the inverters. The delay time is determined by the size and the number of series connected transistors making up the inverters. The gate delay is adopted in the delay circuit 15 out of the consideration of the fact that the setup time of the flip-flop circuit 21 is also determined by the gate delay inside the circuit 21. If manufacturing errors produce absolute variations in the transistor characteristics, the fact that the demodulation circuit of this embodiment is formed in a single semiconductor substrate reduces the relative variations in characteristic between the transistors making up the flip-flop circuit 21 and those of the delay circuit 15 to a virtually negligible level. In other words, this embodiment can reduce influences from the manufacturing errors and apparently eliminates the setup time of the flip-flop circuit 21.

The delay time produced by the low-pass filter 11 is determined mainly by the resistance and capacitance of the filter, so the RC delay circuit 16 is made up of a low-pass filter that provides a similar delay time and an inverter. The RC delay circuit 16 may include, for example, two stages of a primary low-pass filter 16A, 16B and an inverter, connected in series. In such a two-stage configuration, an example case is considered in which the input of the RC delay circuit 16 changes from a low logical level to a high logical level. The delay time for the first stage is the time it takes for the output of the primary low-pass filter 16A at the first stage to rise from a logical low level to a logical threshold voltage of the first-stage inverter. Because the input of the second-stage low-pass filter 16B, on the contrary, changes from a high level to a low level, the delay time for the second stage is the time the output of the second-stage primary low-pass filter 16B takes to decrease from the high logical level to the logical threshold voltage of the second-stage inverter. Inverting the signal in this way allows a desired delay time to be inserted without being affected by the supply voltage. Since the demodulation circuit is formed in one and the same semiconductor substrate, the characteristic variations of the resistors and capacitors making up the low-pass filters 16A, 16B can be made to correspond with high precision to those of the resistors and capacitors of the low-pass filter 11. Hence, it is possible to match the delay time of the RC delay circuit 16 to the delay time of the low-pass filter 11.

The timing adjust latch 17 is used to give a time delay almost equal to that caused by the sampling performed by the A/D convertor 13 in the phase detection circuit 2, by causing the flip-flop circuit to perform the similar operation to that of the A/D convertor 13. The phase demodulation circuit 4 receives the output VA from the phase detection circuit 2 and the output SIGN from the binary phase detection circuit 3 and have them processed by the exclusive-OR circuit 22 to produce a phase difference quantity VP, which is then delayed one symbol by a shift register 23. The difference VD between the output VP of the exclusive-OR circuit and the one-symbol-delayed signal VD is taken by the subtraction logic 24 to generate a demodulated output VOUT.

In FIG. 3, at the input stage of the exclusive-OR circuit 22 there is provided a latch circuit 38 that latches the digital output VA and the sign signal SIGN in synchronism with a clock signal 39. The clock signal 39 may, for example, be a signal whose phase is delayed within one cycle of the sampling clock. The flip-flop 17 takes in the output of the delay circuit 16 in synchronism with the sampling clock 25 of the A/D convertor 13. In this embodiment, the conversion operation of the A/D convertor 13 is established before the next sampling cycle of the sampling clock 25, and the sign signal SIGN is fed to the multiplication logic 22 in synchronism with the digital output VA. The latch circuit 38 supplies the digital output VA and the sign signal SIGN simultaneously to the exclusive-OR circuit 22.

Figure 4:
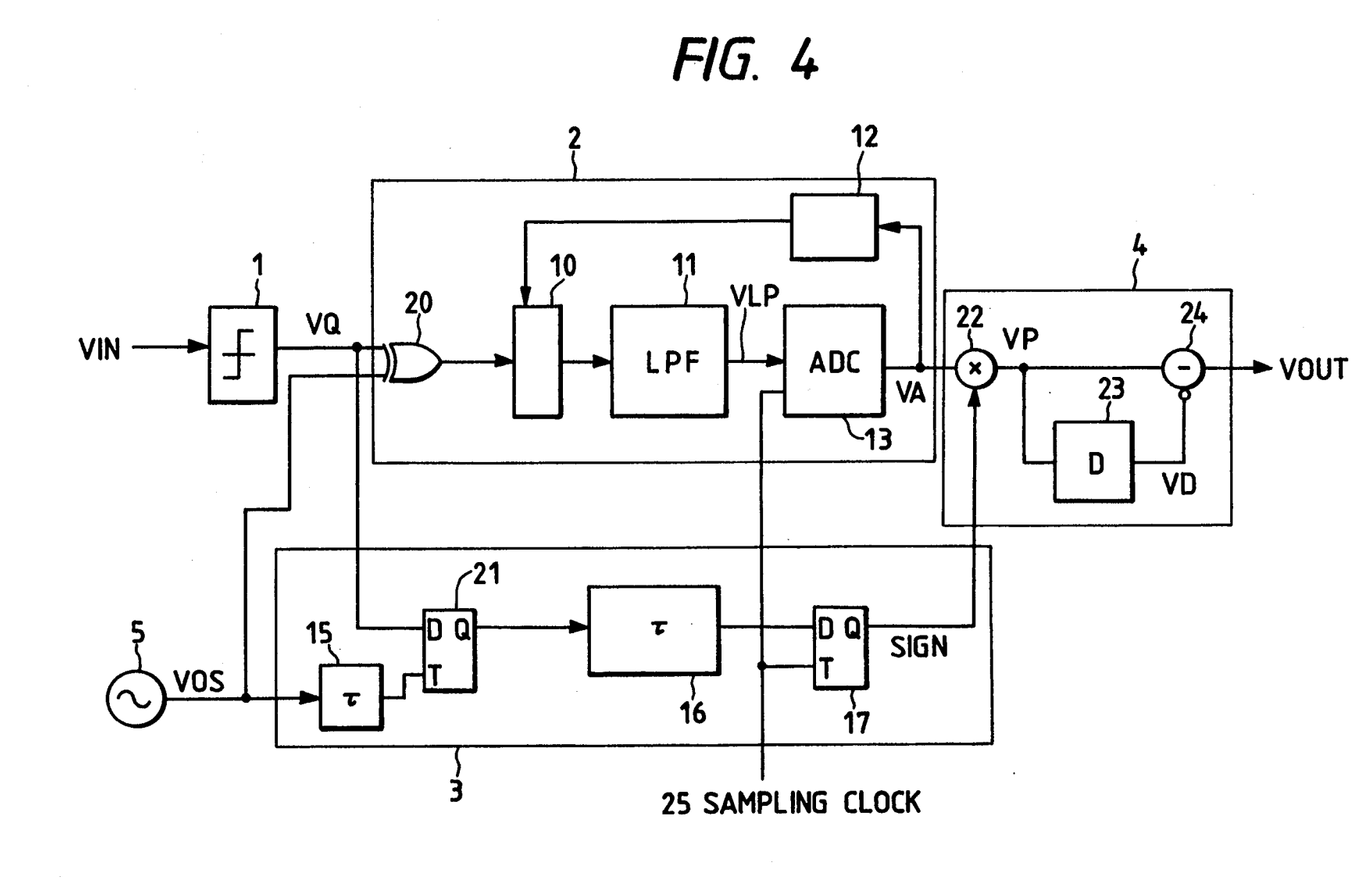
FIG. 4 is a block diagram showing another embodiment of the demodulation circuit according to this invention.

FIG. 4 shows the second embodiment of the demodulation circuit according to this invention. This embodiment is similar to the preceding embodiment, except that the supply voltage of the level limiter 10 is adjusted by the output of the reference voltage adjust circuit 12. That is, to the non-inverted input terminals (+) of the amplifiers 30, 31 in FIG. 3 there can be supplied adjusted voltages through the switches 34, 35, and to the non-inverted input terminals (+) of the amplifiers 32, 33, voltages of certain levels are applied. With this configuration, the same effect as that of the above embodiment can be obtained.

FIG. 5 shows one example of a portable communication terminal device incorporating the demodulation circuit of this invention. This portable communication terminal device includes a voice coding/decoding unit (or voice codec unit) 201, a phase modulation/demodulation unit 202, and a high frequency unit 203. A microcomputer 340 controls the operation sequence, energizing and deenergizing of these units 201–203.

The voice coding/decoding unit 201 includes: a prefilter 211 that suppresses high-frequency noise components of a transmitted analog voice signal entered from a microphone 210; an A/D convertor 212 that converts the output of the pre-filter into a digital signal; a digital signal processor (or DSP for short) that compresses the voice band by the digital signal processing or expands the compressed, received digital voice signal to its original band; a D/A convertor 214 that converts the expanded output of the DSP 213 into an analog voice signal; a post-filter 215 that suppresses a harmonic component of the output and amplifies the output; and a speaker 216 that is driven by the output of the post-filter 215.

The phase modulation/demodulation unit 202 includes: a phase modulator 220 which performs modulation suitable for radio transmission, say, 7/4 shift QPSK modulation, on the signal output from the DSP 213; a D/A convertor 221 to convert the output into an analog signal; a post filter 222 for suppressing harmonic components of the output; a phase/voltage convertor 223 that suppresses wide-band noise components contained in the received modulated signal and at the same time converts phase information into voltage temporarily; an A/D convertor 224 that converts the output of the phase/voltage convertor 223 into a digital signal; a phase demodulator 225 that demodulates the original fundamental signal components from the output of the A/D convertor 224; an offset adjust circuit 225; and the above-mentioned local oscillation circuit 5. The above phase modulator 220 is often realized by a read only memory. The phase modulator 220, D/A convertor 221 and post-filter 222 are each provided in two or more sets in parallel so as to produce signals 90 degrees out of phase or orthogonal signals, or to produce signals of positive and negative phases. Shown in the figure are two systems, one consisting of D/A convertor and post-filter designated 221-1 and 222-1, and the other consisting of D/A convertor and post-filter denoted 221-2 and 222-2.

In this phase modulation/demodulation circuit 202, the phase/voltage convertor 223 includes circuits that corresponds, for example, to the comparator circuit 1, exclusive-OR circuit 20, level limiter 10, low-pass filter 11, delay circuit 25, flip-flop circuit 21, and RC delay circuit 16 in FIG. 1. The A/D convertor 224 includes circuits that corresponds to the reference voltage adjust circuit 12, A/D convertor 13, and flip-flop circuit 17. The phase demodulator 225 has a circuit corresponding to the phase modulation circuit 4.

The high frequency unit 203 includes, for example, an orthogonal modulator 230 that performs orthogonal modulation on the signal output from the post-filter 222 and further modulates it with a radio frequency carrier of about 800 MHz to 2 GHz; a high power amplifier 233 to amplify the output of the modulator 230 to a specified sending power and to oscillate the antenna 232 through a send/receive changeover switch 231; an amplifier 234 to amplify the signal received through the antenna 232 and switch 231; and a detector 235 to detect a desired signal from the output of the amplifier 234. Depending on the system configuration, the orthogonal modulator 230 may perform two or more stages of modulation in which a first modulation is done by using a relatively low frequency at, say, 455 kHz to 90 MHz, followed by a second modulation using a radio frequency carrier at around 800 MHz to GHz. Similarly, the detector 235 may also be configured in a plurality of stages. Though not shown in the figure, the portable communication terminal device is also provided with a key pad, a dial signal generator, a call signal generator, a control microcomputer, a clock signal generator, a power supply circuit having a battery as a source, and a power switch for controlling the turn-on and turn-off of power.

The phase modulation/demodulation circuit 202 and other electronic circuits 201,203 built into the portable communication terminal device are so formed that each of these circuits can be operated with low supply voltage and low power consumption. For instance, the voice modulation/demodulation unit 201 stops the operation of the major portion of the circuit when it detects a no-voice state; and in addition to the circuit halt during the no-voice state, the phase modulation/demodulation unit 202 and the high frequency unit 203 utilize the system configuration specification, i.e. time division multiplex of radio communication, to operate the major portion of the circuit intermittently to lower the power consumption. Such a control is performed by the microcomputer 240 as it detects the state of each circuit.

In addition, the reference voltage adjust circuit 12 in the demodulation circuit of this invention, as described above, is operated only when power is turned on (for example, when a power switch is turned on) or when a standby is cleared (when the portable communication terminal device is switched from the standby state, in which all or part of the circuits of the phase modulation/demodulation unit 202 of the device is rendered inactive, to a call ready state, in which voice communication can be made). Once the reference voltage has been adjusted, the circuit necessary to keep the output of the addition circuit 19 active is kept operational only during the time that a voice communication requiring the demodulation operation is made, with the remaining circuits in the reference voltage adjust circuit 12 rendered inactive. This circuit configuration realizes a phase modulation/demodulation unit 202 most suited for use with battery supply and also a portable communication terminal device incorporating this unit. That is, when the portable communication terminal is switched on for power-on resetting and when, after power is turned on, the portable communication terminal device is switched from the standby state—in which all or part of the circuits of the phase modulation/demodulation unit 202 of the device is rendered inactive—to a call ready state, in which voice communication can be made, the microcomputer 240 activates the component circuits of the reference voltage adjust circuit 12 to start adjusting the dynamic range of the A/D convertor 13. With the adjust operation started, the microcomputer 240 uses a timer incorporated therein (not shown) to monitor the completion of the first and second operation of the reference voltage adjust circuit 12. Until a timing when the adjustment can be deemed to have been already completed, the microcomputer 240 maintains the operation of the circuit necessary to keep the selected state of the switch 34, 35 of the reference voltage adjust circuit 12 in FIG. 3. As a result, circuits such as comparator 18 that are used for only the reference voltage adjustment are made inactive to reduce the waste of power. When the phase modulation/demodulation unit 202 moves into a standby state, the reference voltage itself is no longer necessary, so that the microcomputer 240 turns all the component circuits of the reference voltage adjust circuit 12 into an inactive state.

The foregoing descriptions offer the following advantages.

(1) With the level limiter 10 and the reference voltage adjust circuit 12 in the phase detection circuit 2, it is possible to reduce errors caused by deviations of internal signal voltages when the internal analog signals are converted into digital signals by the A/D convertor 13.

(2) Only when power is turned on or when the standby is reset, the reference voltage adjust circuit 12 is operated. After the reference voltage adjustment is finished, the circuit necessary to keep the output of the addition circuit 19 active is kept operational only during the time that a voice communication requiring the demodulation operation is made, with the remaining circuits in the reference voltage adjust circuit 12 rendered inactive. As a result, the power consumption can be minimized even when the reference voltage circuit 12 is employed in the demodulation circuit.

(3) Because of the use of the delay circuit 15, which apparently eliminates the setup time of the flip-flop circuit 21 that receives at its data input a quantized input signal VQ from the comparator circuit 1, it is possible to detect even a slight change between phase lag and lead by the flip-flop circuit 21 with high precision. This makes it possible for the flip-flop circuit 21 to produce a change between phase lag and lead at its output in synchronism with a change in the pulse width corresponding to the phase difference that is obtained at the output of the exclusive-OR circuit 20.

(4) Considering the fact that the setup time of the flip-flop circuit 21 is determined based on the gate delay of the circuit 21, the delay circuit 15 is formed of an even number of series-connected inverter stages. Because the demodulation circuit is formed in a single semiconductor substrate, if there are absolute characteristic variations of transistors caused by manufacturing errors, the relative characteristic variations between the transistors making up the flip-flop circuit 21 and the transistors making up the delay circuit 15 are virtually negligible. This minimizes the influences of manufacturing errors and makes it possible to apparently neglect the setup time of the flip-flop circuit 21.

(5) Considering the fact that the delay time of the low-pass filter 11 is determined by resistance and capacitance, the delay circuit 16 is formed of a low-pass filter and an inverter to provide the similar delay time. Because the demodulation circuit is formed in one and the same semiconductor substrate, characteristic variations of the resistors and capacitors making up the delay circuit 16 can be made to correspond to those of the resistors and capacitors making up the low-pass filter 11 with high precision. Therefore, it is possible to match with high precision the delay times of the low-pass filter 11 and of the RC delay circuit 16.

(6) The delay circuit 16 has two stages of a primary low-pass filter 16A, 16B and an inverter connected in series. This configuration allows the setting of a desired delay time virtually without being affected by variations in supply voltage.

(7) The delay circuits 15, 16 and flip-flop circuits 21, 17 used to make equal the delay times of the phase detection circuit 2 and of the binary phase detection circuit 3 can reduce errors in the phase difference quantity VP obtained at the output of the multiplication logic 22 that would be caused by the difference between the delay times of the phase detection circuit 2 and the binary phase detection circuit 3.

The present invention has been described in conjunction with the above embodiments. It is noted, however, that the invention is not limited to these embodiments but that various modifications may be made without departing from the spirit of the invention. For example, the comparator circuit may be replaced with an amplifier. The two-value decision circuit 14 may be replaced with a phase comparator commonly used in PLL. The A/D convertor is not limited to the parallel comparison type but may be a sequential comparison type or oversampling type as long as it can achieve a specified operation speed.

While the above description takes up an example case where the invention is applied to a portable communication terminal device, a field in which the invention has originated, this invention is not limited to this application but can also be applied to various other circuits and semiconductor integrated circuits requiring a demodulation circuit.

Representative features of this invention may be summarized as follows.

The level limiter and the reference voltage adjust circuit in the phase detection circuit can reduce errors caused by deviations in internal signal voltages when the internal analog signals are converted into digital signals by an A/D convertor.

The delay circuit and flip-flop used to make equal the delay times of the phase detection circuit and of the binary phase detection circuit can reduce errors in the phase difference quantity at the output of the multiplication logic that would be caused by the difference in delay time between these circuits.

Considering the fact that the operation delay of the first flip-flop circuit is a gate delay, the first delay circuit is formed by a circuit which produces a delay by the gate delay. Because the second delay circuit corresponds to the operation delay of the low-pass filter, it is formed by a circuit that generates a delay analogwise. The demodulation circuit in the form of a semiconductor integrated circuit with the above configuration reduces relative variations in circuit elements' characteristic between the phase detection circuit and the binary phase detection circuit to a virtually negligible level even when there are absolute variations in the circuit elements caused by manufacturing errors. This in turn reduces the demodulation circuit's susceptibility to influences of manufacturing errors and therefore errors in the modulation circuit. In this way, it is possible to produce a demodulation circuit suited for use in a semiconductor integrated circuit and which is free from influences of manufacturing errors of circuit elements and from demodulation errors.

We claim:

1. A demodulation circuit comprising:
   a phase detection circuit for determining a digital absolute value of a phase difference between an input signal to be demodulated and a reference signal;
   a binary phase detection circuit for converting a phase lead or lag between the input signal and the reference signal into a sign of phase difference; and
   a phase demodulation circuit for calculating, from the absolute value and the sign of phase difference, a phase difference quantity between the input signal no be demodulated and the reference signal and for performing a delay detection on the phase difference quantity;
   wherein the binary phase detection circuit includes a delay means which generates a delay time corresponding to the operation delay of the phase detection circuit; and
   wherein the phase detection circuit includes a level limiter circuit to limit an internal signal voltage and a reference voltage adjust circuit to correct deviations in the internal signal voltage.

2. A demodulation circuit according to claim 1, wherein the phase detection circuit includes:
   a comparator circuit for quantizing the input signal into a binary value;
   an exclusive-OR circuit which takes in the output of the comparator circuit and the reference signal;
   a low-pass filter; and
   an A/D convertor circuit which converts an analog output of the low-pass filter into a digital signal;
   wherein the reference voltage adjust circuit is coupled to the output of the A/D convertor circuit to adjust the dynamic range of the A/D convertor circuit; and
   wherein the level limiter circuit is coupled to the exclusive-OR circuit and supplies its output signal whose voltage level is limited to the low-pass filter.

3. A demodulation circuit according to claim 1, wherein the phase detection circuit includes:
   a comparator circuit for quantizing the input signal into a binary value;
   an exclusive-OR circuit which takes in the output of the comparator circuit and the reference signal;
   a low-pass filter; and
   an A/D convertor circuit which converts an analog output of the low-pass filter into a digital signal;
   wherein the level limiter circuit controls the output voltage level of the exclusive-OR circuit and transfers it to the low-pass filter; and
   wherein the reference voltage adjust circuit adjusts the dynamic range of the level limiter circuit according to the output of the A/D convertor circuit.

4. A demodulation circuit according to claim 2, wherein the binary phase detection circuit includes:
   a first flip-flop circuit which takes in the output signal of the comparator circuit as an input;
   a first delay circuit which takes in the reference signal as an input and supplies its output as a clock input to the first flip-flop circuit and which generates a delay time to apparently eliminate a setup time of the first flip-flop circuit; and
   a second flip-flop circuit which takes in a sampling clock signal for the A/D convertor circuit as its clock input and takes in a signal to produce a sign of the phase difference;
   wherein the delay means includes a second delay circuit which receives the output of the first flip-flop circuit and sends it to the second flip-flop circuit and which generates a delay that virtually matches the operation delay time of the low-pass filter of the phase detection circuit.

5. A demodulation circuit according to claim 4, wherein the phase detection circuit, the binary phase detection circuit and the phase demodulation circuit are formed in a single semiconductor substrate.

6. A demodulation circuit according to claim 3, wherein the binary phase detection circuit includes:
   a first flip-flop circuit which takes in the output signal of the comparator circuit as an input;
   a first delay circuit which takes in the reference signal as an input and supplies its output as a clock input to the first flip-flop circuit and which generates a delay time to apparently eliminate a setup time of the first flip-flop circuit; and
   a second flip-flop circuit which takes in a sampling clock signal for the A/D convertor circuit as its clock input and takes in a signal to produce a sign of the phase difference;
   wherein the delay means includes a second delay circuit which receives the output of the first flip-flop circuit and sends it to the second flip-flop circuit and which generates a delay that virtually matches the operation delay time of the low-pass filter of the phase detection circuit.

7. A demodulation circuit according to claim 6, wherein the phase detection circuit, the binary phase detection circuit and the phase demodulation circuit are formed in a single semiconductor substrate.

8. A demodulation circuit according to claim 1, wherein the phase demodulation circuit includes:
   a multiplication circuit which takes in the absolute value and the sign of the phase difference;
   a shift register which delays the output of the multiplication circuit by one unit element of modulation in order to perform a delay detection; and
   a subtraction circuit which subtracts a value of the shift register from the output of the multiplication circuit.

* * * * *

UNITED STATES PATENT AND TRADEMARK OFFICE
CERTIFICATE OF CORRECTION

PATENT NO. : 5,406,218
DATED : April 11, 1995
INVENTOR(S) : Yukihito Ishihara, et al.

It is certified that error appears in the above-indentified patent and that said Letters Patent is hereby corrected as shown below:

Claim 1, column 13, line 35, delete "no" and substitute therefor --to--.

Signed and Sealed this

Thirtieth Day of May, 1995

*Attest:*

BRUCE LEHMAN

*Attesting Officer*     *Commissioner of Patents and Trademarks*